United States Patent

Heide

[11] Patent Number: 5,825,323
[45] Date of Patent: Oct. 20, 1998

[54] RADAR SENSOR

[75] Inventor: Patric Heide, München, Germany

[73] Assignee: Siemens Aktiengesellschaft, Munich, Germany

[21] Appl. No.: 776,688

[22] PCT Filed: Aug. 7, 1995

[86] PCT No.: PCT/DE95/01037

§ 371 Date: Feb. 18, 1997

§ 102(e) Date: Feb. 18, 1997

[87] PCT Pub. No.: WO96/05518

PCT Pub. Date: Feb. 22, 1996

[30] Foreign Application Priority Data

Aug. 17, 1994 [DE] Germany ............... P 44 29 118.3

[51] Int. Cl.$^6$ ................................................. G01S 13/62
[52] U.S. Cl. ....................... 342/114; 342/28; 342/194
[58] Field of Search ......................... 342/28, 114, 194

[56] References Cited

U.S. PATENT DOCUMENTS

| | | | |
|---|---|---|---|
| 4,331,958 | 5/1982 | Lacomme | 342/152 |
| 4,439,766 | 3/1984 | Kobayashi et al. | |
| 4,860,014 | 8/1989 | Shores et al. | 342/105 |
| 4,937,580 | 6/1990 | Wills | 342/22 |
| 5,402,129 | 3/1995 | Gellner et al. | 342/70 |
| 5,481,270 | 1/1996 | Urkowitz et al. | 342/101 |
| 5,504,455 | 4/1996 | Inkol | 329/304 |

FOREIGN PATENT DOCUMENTS

| | | |
|---|---|---|
| 0 291 337 | 11/1988 | European Pat. Off. . |
| 0 644 438 | 3/1995 | European Pat. Off. . |

OTHER PUBLICATIONS

1984 IEEE, "A Simple Method for Sampling In–Phase and Quadrature Components", Correspondence, pp. 821–824.
S. Mass, Microwave Mixers, Artech House, Inc., 1993, pp. 237–312.
J. Detlefsen, Radartechnik, Springer–Verlag, pp. 77–81.
P. Heide et al., "24 Ghz Low–Cost Doppler Speed–over–Ground Sensor with Fundamental–Frequency PHEMT–DRO", IEEE GAAS '94 European GaAs Applications Symposium, Apr. 28–29, 1994 in Torino, Italy.

*Primary Examiner*—John B. Sotomayor
*Attorney, Agent, or Firm*—Hill & Simpson

[57] ABSTRACT

In the case of this radar sensor, a phase shifter is inserted between a microwave generator and an antenna and can be switched over between two phases. A demodulator (DM) demodulates the received reflected signal, which has superimposed on it the microwave signal which originates from the microwave generator. A de-multiplexer (DEMUX) which is connected downstream of the demodulator (DM) separates the two phase-shifted demodulated signals. The measurement result is largely noise-free.

11 Claims, 1 Drawing Sheet

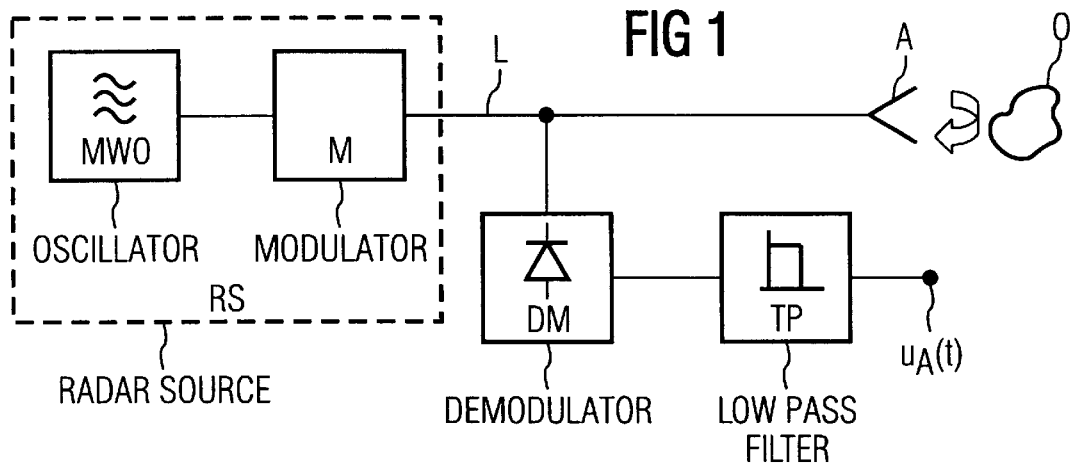
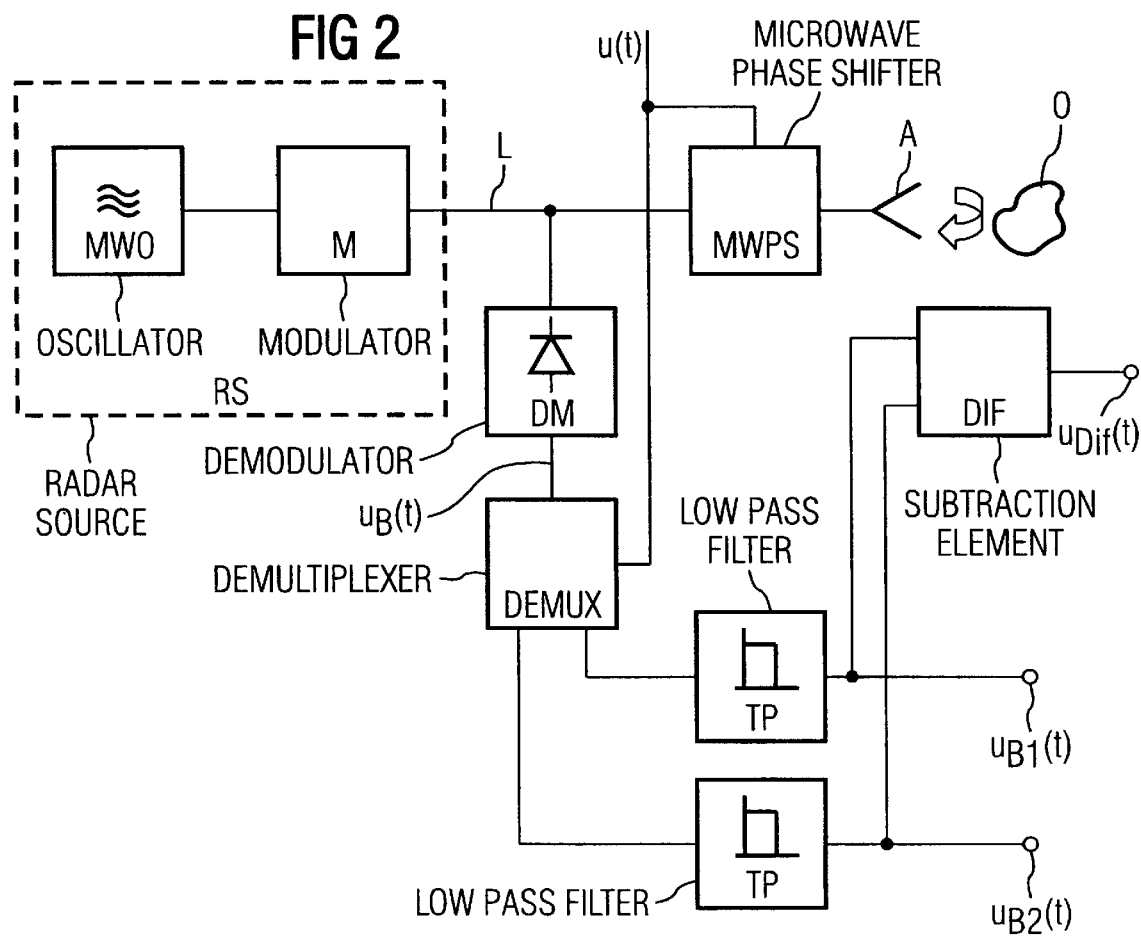

RADAR SENSOR

BACKGROUND OF THE INVENTION

1. Field of the Invention

The present invention relates to a radar sensor with which, for example, the speed and/or the movement direction of an object can be determined.

2. Description of the Related Art

Radar sensors are widely used for contact-free measurement of object speeds and object separations. In this case, because of their robustness to environmental influences, radar sensors offer critical advantages in comparison with optical and acoustic sensors for operation in rugged operational conditions.

For cost reasons, radar sensors frequently contain homodyne receivers, that is to say the demodulation is carried out by mixing the frequency of the received signal directly with the transmitted signal. Since, in practice, the radar signal source is noisy containing (for example oscillator noise), the transmitted signal already contains noise. If a so-called single-diode mixer with only one diode which is (generally a Schottky diode) is used as the receiver, also called the demodulator, in simple radar sensors, then the noise in the transmitted signal causes an increase in the received noise level. FIG. 1 shows a block diagram of a radar sensor corresponding to the prior art, as is known from the publication by P. Heide, V. Magori, R. Schubert, R. Schwarte: "24 GHz Low-Cost Doppler Speedover-Over-Ground with Fundamental-Frequency PHEMT-DRO", IEEE GAAS' 94, Turin (Italy), April 1994. The radar signal source RS comprises a microwave oscillator MWO and generally also contains components for modulation M, so that the radar signal source RS generally produces a radar signal which is modulated as required. The choice of the modulation depends on the measurement task of the radar sensor. The signal which is produced by the radar signal source RS is emitted via the antenna A and is reflected back into the antenna A, as the received signal, from objects O which are located in the antenna lobe. The transmitted signal and received signal, described by complex field strengths $\underline{E}_S$ and $\underline{E}_R$, are superimposed additively on the cable L between the radar signal source RS and the antenna A. The demodulator DM, which is connected to the cable L, produces homodyne demodulation and supplies the demodulated output signal $u_A(t)$, which is generally designated as the Doppler signal. The low-pass filter (TP) determines the measurement bandwidth of the output signal. The output signal $u_A(t)$ results approximately, as a consequence of the square component of the characteristic of the Schottky diode which is used in the demodulator (DM) and after low-pass filtering as:

$$u_A(t) \sim (Re\{\underline{E}_S + \underline{E}_R\})^2 = E_S^2 + E_R^2 + 2E_S E_R \cos(\angle \underline{E}_S \underline{E}_R) \approx E_S^2 + 2E_S E_R \cos(\angle \underline{E}_S \underline{E}_R)$$

where $\underline{E}_S$ = complex transmitted field strength (corresponds to transmitted signal)

$\underline{E}_R$ = complex received field strength (corresponds to the received signal)

$2E_S E_R \cos(\angle \underline{E}_S \underline{E}_R)$ = wanted signal $E_S^2$ = demodulated transmitted signal (noisy interference signal)

$E_R^2$ = demodulated received signal $E_R << E_S$ Received signal much smaller than the transmitted signal Because of the noise from the radar signal source RS, the amplitude of the transmitted signal is not constant, and thus the term $E_S^2$ is also noisy. $E_S^2$ can thus be regarded as an interference signal which has a disadvantageous effect as a result of the reduction as in the signal to noise ratio of the output signal $u_A(t)$.

In more complex radar sensors, this disadvantage is circumvented by the use of so-called balanced mixers which are described, inter alia, in the book by Stephen A. Maas: "Microwave Mixers", Artech House, Dedham, Mass. (USA). However, the radar sensor in consequence becomes considerably more complex. In addition, the mixers themselves also produce noise contributions which are not suppressed by the use of balanced mixers.

SUMMARY OF THE INVENTION

An object of the invention is to provide an arrangement for a radar sensor, in the case of which quadrature demodulation is possible which until now has made the use of a second mixer necessary, according to the prior art as described in the publication by J. Detlefsen: "Radartechnik" [Radar technology] page 77 ff., Springer Press, 1989. Quadrature modulation makes it possible to determine the movement direction of moving objects.

This and other objects and advantages of the invention are achieved by a radar sensor, in which a means for producing a transmitted signal is connected to a phase shifter and to a demodulator, in which the phase shifter is connected to an antenna for emission of the transmitted signal and for reception of the reflected signal, in which a demultiplexer is connected downstream of the demodulator and is clocked in the same way as the phase shifter with a changeover signal, and in which the outputs of the demultiplexer are each connected to a low-pass filter on which the output signals can be picked off.

Further developments of the invention provide that the demodulator is a mixer. The demodulator may be a single-diode mixer or a non-linear element. The changeover signal is, in a preferred embodiment, a periodic square-wave signal, and the frequency of the changeover signal is higher than the desired bandwidth of the output signals.

In one embodiment, a subtraction element is connected downstream of the low-pass filters in order to subtract the output signals from one another.

The phase difference which is produced by the phase shifter is in the range from 0° to 180°, and in one embodiment the phase difference which is produced by the phase shifter is 180°.

The demultiplexer of the preferred embodiment is a changeover switch. The means for producing a transmitted signal has a microwave oscillator which is connected to a modulation unit.

The invention provides for the use of the radar sensor for speed measurement and/or for movement direction identification.

In the development according to claim 5, neither the noise in the transmitted signal (irrespective of the modulation of the transmitted signal) nor the noise of the demodulator have any influence on the measurement accuracy.

Noise suppression and quadrature demodulation are possible at the same time.

BRIEF DESCRIPTION OF THE DRAWING

The invention will be explained in more detail with reference to the FIGURES, in which:

FIG. 1 is a schematic diagram which shows the design of a radar sensor according to the prior art from P. Heide, V. M ágori, R. Schubert, R. Schwarte: "24 GHz Low-Cost Doppler Speed-over-Ground with Fundamental-Frequency PHEMT-DRO", IEEE GAAS' 94, Turin (Italy), April 1994.

FIG. 2 is a schematic diagram which shows the design of the radar sensor according to the invention.

DETAILED DESCRIPTION OF THE PREFERRED EMBODIMENT

In addition to the arrangement corresponding to the prior art and according to FIG. 1, the arrangement according to the invention and as shown in FIG. 2 has a microwave phase shifter MWPS, a demultiplexer DEMUX, a subtraction element DIF and a second low-pass filter TP.

The phase of the received signal $E_R$ and, as a consequence, the phase of $2E_S E_R \cos(\angle E_S E_R)$, which corresponds to the wanted signal, are switched over between the two phase angles with a phase difference $\Delta\phi$, controlled by, for example, a periodic TTL signal u(t), with the aid of the microwave phase shifter MWPS. At the same time, the demodulated output signal $u_B(t)$ is split between two output signals $u_{B1}(t)$, $u_{B2}(t)$, which correspond to the two phase angles. The two equations for the output signals $u_{B1}(t)$, $u_{B2}(t)$ are as follows:

$$u_{B1}(t) \approx E_S^2 + 2E_S E_R \cos(\angle E_S E_R)$$

$$u_{B2}(t) \approx E_S^2 + 2E_S E_R \cos([\angle E_S E_R] + \Delta\phi)$$

If one chooses $\Delta\phi = 180°$ then a difference signal $u_{DIF}(t)$ can be formed as follows:

$$u_{DIF}(t) = u_{B1}(t) - u_{B2}(t) = 4E_S E_R \cos(\angle E_S E_R)$$

The difference signal $u_{DIF}(t)$ no longer contains either the noise term $E_S^2$, which is caused by the noise from the radar signal source RS, nor the noise contributions from the demodulator DM itself. The difference signal $u_{DIF}(t)$ thus has a considerably higher signal to noise ratio than the signal $u_A(t)$ according to FIG. 1.

The changeover signal u(t) is, for example, a periodic square-wave signal at the changeover frequency $f_u$. Noise suppression makes sense if the changeover frequency $f_u$ is at least one order of magnitude higher than the desired bandwidth of the output signals $u_{B1}(t)$, $u_{B2}(t)$ according to FIG. 2.

In principle, any required signal wave forms of the changeover signal u(t) are permissible which allow a rapid changeover in comparison with the frequencies contained in the noise.

If the phase difference $\Delta\phi$ is not chosen to be 180°, but $0 < |\Delta\phi| < 180°$, then $u_{B1}(t)$ and $u_{B2}(t)$ contain orthogonal signal components or are even completely orthogonal for $\Delta\phi = \pm 90°$. As a consequence, the arrangement according to the invention and as shown in FIG. 2 also allows quadrature demodulation. The advantage over the prior art as known from the publication by J. Detlefsen: "Radartechnik" [Radar technology] page 77 ff., Springer Press, 1989 is that there is no need for a second demodulator DM for quadrature demodulation.

A further development of the invention is to select the phase difference $\Delta\phi$ to be in the range from $0 < |\Delta\phi| < 180°$ and once again to form the difference between the output signals $u_{B1}(t)$ and $u_{B2}(t)$, $u_{DIF}(t) = u_{B1}(t) - u_{B2}(t)$. The arrangement now provides three output signals. The difference signal $u_{DIF}(t)$ is a signal from which noise has been removed, and the output signals $u_{B1}(t)$ and $u_{B2}(t)$ are the quadrature components for identification of the object movement direction.

The demodulator need not be a single-diode mixer but may be any desired mixer or any desired non-linear component with which frequency mixing can be carried out.

The changeover signal u(t) may also be a non-periodic signal.

A changeover switch, inter alia, may be used as the demultiplexer DEMUX, or else an element which samples, digitizes and stores the demodulator signal $u_B(t)$.

Although other modification and changes may be suggested by those skilled in the art, it is the intention of the inventor to embody within the patent warranted hereon all changes and modifications as reasonably and properly come within the scope of his contribution to the art.

I claim:

1. A radar sensor, comprising:
   a phase shifter;
   a demodulator;
   means for producing a transmitted signal connected to said phase shifter and to said demodulator, phase shifter (MWPS) is connected to
   an antenna connected to said phase shifter for emission of a transmitted signal and for reception of a reflected signal,
   a demultiplexer connected downstream of the demodulator and clocked in a same way as the phase shifter with a changeover signal, and
   a low-pass filter connected to each output of said demultiplexer on which output signals are available.

2. A radar sensor as claimed in claim 1, wherein said demodulator is a mixer.

3. A radar sensor as claimed in claim 1, wherein said demodulator is a single-diode mixer.

4. A radar sensor as claimed in claim 1, wherein said changeover signal is a periodic square-wave signal, and a frequency of the changeover signal is higher than a desired bandwidth of the output signals.

5. A radar sensor according to claim 1, further comprising:
   a subtraction element connected downstream of the low-pass filters to subtract the output signals from one another.

6. A radar sensor as claimed in claim 5, wherein the phase difference which is produced by the phase shifter is 180°.

7. A radar sensor as claimed in claim 1, wherein the phase difference which is produced by the phase shifter is in the range from $0 < \Delta\phi < 180°$.

8. A radar sensor as claimed in claim 1, wherein said demultiplexer is a changeover switch.

9. A radar sensor as claimed in claim 1, wherein said means for producing a transmitted signal includes a microwave oscillator which is connected to a modulation unit.

10. Use of the radar sensor according to claim 1 for speed measurement and/or for movement direction identification.

11. A radar sensor as claimed in claim 1, wherein said demodulator is a non-linear element.

* * * * *